(12) United States Patent
Griffith et al.

(10) Patent No.: US 6,466,770 B1
(45) Date of Patent: Oct. 15, 2002

(54) BALUN CIRCUIT FOR COMBINING DIFFERENTIAL POWER AMPLIFIER OUTPUTS

(75) Inventors: Scott A. Griffith, San Clemente; Trang N. Trinh, Cypress, both of CA (US)

(73) Assignee: Skyworks Solutions, Inc., Newport Beach, CA (US)

( * ) Notice: Subject to any disclaimer, the term of this patent is extended or adjusted under 35 U.S.C. 154(b) by 0 days.

(21) Appl. No.: 09/386,863

(22) Filed: Aug. 31, 1999

(51) Int. Cl.$^7$ ................................. H04B 1/02
(52) U.S. Cl. .................... 455/91; 455/326; 455/323; 333/25; 343/859
(58) Field of Search ............... 455/91, 326, 323; 343/859; 333/25, 26

(56) References Cited

U.S. PATENT DOCUMENTS

| | | | | |
|---|---|---|---|---|
| 5,148,130 A | * | 9/1992 | Dietrich | 333/25 |
| 5,455,545 A | * | 10/1995 | Garcia | 333/26 |
| 5,818,385 A | * | 10/1998 | Bartholomew | 342/372 |
| 5,844,449 A | * | 12/1998 | Abeno et al. | 332/105 |
| 6,009,318 A | * | 12/1999 | Freed | 455/326 |
| 6,172,652 B1 | * | 1/2001 | Plonka | 348/853 |

* cited by examiner

Primary Examiner—Daniel Hunter
Assistant Examiner—Alan T. Gantt
(74) Attorney, Agent, or Firm—Howrey, Simon, Arnold and White, LLP (57) ABSTRACT

A BALUN circuit comprising a lead network coupled to the positive phase output of a differential power amplifier, a negative phase output coupled to the negative phase output of the differential amplifier, and a delay element coupled in series with the lag network. The output of the lead network and the delay element are combined to form a single-ended output. The lag and lead networks may adjust the output impedances of the positive and negative phase outputs so that the output impedance of the single-ended output is set to a desired value. In one implementation, selected components of the lag and lead networks, and the delay element, comprise printed elements.

41 Claims, 11 Drawing Sheets

Lead Network

BALUN CIRCUIT FOR COMBINING DIFFERENTIAL POWER AMPLIFIER OUTPUTS

BACKGROUND OF THE INVENTION

I. Field of the Invention

This invention relates generally to the field of wireless RF transmitters, and more specifically, to a BALUN circuit for combining the outputs of a differential power amplifier.

II. Background

Power amplifiers are key to any high frequency RF transmitter design. This is because transmitters typically require high output power to compensate for path losses and to achieve satisfactory signal levels at the system antennae. But high frequency power amplifier designs are also subject to performance losses due to parasitic losses in the power amplifier package.

Additionally, transmitter designs for portable wireless communications devices require lower operating voltages in order to increase battery life. The lower operating voltages decrease the system's noise margin. The high gain of the power amplifier means the increased noise level at the amplifier input will be magnified at the amplifier output. This high noise content in the power amplifier output seriously degrades the transmitter's performance.

Another factor that contributes to noise problems in a power amplifier design is that portable system designs also create a need for compact size. This translates into higher integration and smaller packages for portable application components like power amplifiers. The smaller packaging and higher integration means that circuit components are more susceptible to noise from other circuits. The power amplifier will amplify any added noise at the amplifier input, magnifying the problem.

One way to combat these problems for power amplifier design is to use a differential design approach. The differential design increases the amplifier's noise rejection and reduces the effects of parasitic losses. It will also minimize the need for root physical RF ground, due to the inherent virtual ground in a differential design. But the use of a differential output stage requires that both the positive and negative phase outputs be recombined for maximum efficiency.

A BALUN is a wideband transformer that is capable of matching a balanced line, such as a twin lead, to an unbalanced line, e.g., a coaxial cable. Conventional BALUN designs are not suitable for recombining the positive and negative phase outputs of a differential power amplifier either because they do not permit suitable output impedance matching, take up too much area, cost too much or be hard to implement.

Low cost commercial (as opposed to military) ceramic BALUNS, for example, have a purely resistive output impedance, which is incompatible with what is typically a reactive output impedance of the power amplifier. Military grade ceramic BALUNS can be designed to have reactive output impedance, but this is not a cost-effective solution.

Another example is a design that matches the amplifier output to a standard impedance value and then uses a quarter shielded coax center conductor and shield to create a BALUN. But this creates the need to install a trimmed piece of coax, which is wasteful of space, and which can be time consuming and susceptible to errors in a manufacturing environment.

Another example is a design that uses the same match on the positive phase and negative phase outputs and then adds a 180-degree transmission line to adjust the phase of the negative phase output before recombining it with the positive phase output. But this approach takes a large amount of printed circuit board area and has inherent amplitude and phase mismatches during the recombination process. The mismatch results in low power transfer efficiency, which is a key power amplifier design parameter.

Thus, there is a need for a BALUN circuit for combining the outputs of a differential power amplifier that overcomes the disadvantages of the prior art.

SUMMARY OF THE INVENTION

In accordance with the invention as described in this document, a BALUN circuit in accordance with the subject invention comprises a lead network, a lag network, and a delay element. The lead network is connected to the positive phase output of a differential power amplifier (PA). The lag network is connected to the negative phase output of the differential PA. The delay element follows and is coupled in series with the lag network. The outputs of the lead network and the delay element are combined to form the single-ended output of the PA.

The lead network is configured to advance the phase of the positive phase output of the PA. The lag network is configured to retard the phase of the negative phase output of the PA. The delay element further retards the phase of the negative phase output of the PA such that, at the point of combination, the phases of the two outputs are approximately equal.

Each of the outputs of the differential PA is assumed to have arbitrary impedance having resistive and reactive components. In one embodiment, the BALUN circuit of the subject invention is configured to transform the arbitrary complex impedance of the PA outputs to a desired output impedance of the single-ended output of the PA. In one implementation, the desired output impedance is purely a resistive impedance $Z_0$. In this implementation, the lead network is configured to transform the assumed complex impedance of the PA's positive phase output to about twice $Z_0$, and the lag network is also configured to transform the assumed complex impedance of the PA's negative phase output to about twice $Z_0$. Similarly, in this implementation, the impedance of the delay element is about twice $Z_0$. The impedance of the single-ended output, which is the parallel combination of the output impedance of the lead network and the phase element, is about $Z_0$ as desired.

For purposes of this disclosure, phrases such as "about" or "approximately" or "substantially" are intended to allow for tolerances which are acceptable to those of skill in the art who practice the invention.

It should be noted that the impedance of the delay element can be different than twice $Z_0$. In this case, the delay element becomes part of the lag network impedance transformer. However, the design is more complex and the bandwidth is usually very narrow. Therefore, it is advantageous if the impedance of the delay element is about equal to the desired impedance of twice $Z_0$.

In one embodiment, the lead network comprises a high pass LC (inductor-capacitor) circuit, and the lag network comprises a low pass LC circuit. In this embodiment, the component values of the high pass circuit are selected such that the phase of the positive PA output is advanced by a first amount. In addition, in this embodiment, the component values of the low pass circuit are selected such that the phase of the negative PA output is retarded by a second amount. The delay element is configured such that the phase of the negative PA output is further retarded by a third amount. The first, second, and third amounts are such that the phase of the PA outputs at the point of combination is about equal.

In one implementation, the component values of the high pass network are selected using a Smith chart or the like such that the output impedance of the high pass network is about $2Z_0$. In addition, in this implementation, the component values of the low pass network are also selected using a Smith chart or the like such that the output impedance of the low pass network is about $2Z_0$.

In one implementation example, the inductors in the high and low pass networks, and the delay element, are each printed microstrip elements on the PCB board embodying the BALUN circuit, while the capacitors in the high and low pass networks are discrete components. These printed elements can be microstrip, embedded microstrip, or stripline elements. Alternatively, these elements could be composed of any other type of transmission line in place of the printed element or even discrete components. However, the printed transmission lines are preferred because they are the least costly and require the least amount of board space.

In one configuration, the PA is designed for a 2.4 GHz cordless handset system operation and the single ended output is connected to a low pass filter. The signal is passed through the filter before being transmitted via an antenna. In this implementation, the component values and circuit characteristics are chosen for 2.4 GHz operation.

In a second implementation, the design is used in a 900 MHz cordless handset system. In this case, the component values and circuit characteristics are selected for 900 MHz operation. Additional implementations are possible in which the design is utilized in a direct sequence spread spectrum (DSSS) wireless system, a Frequency Hop spread spectrum (FHSS) wireless system, a wireless cellular system, a wireless local area network (WLAN) system, a Wireless Modem, a security system, or a wireless inventory system. In fact, the design can be utilized in any system that uses a differential PA keeping in mind that, in each of these implementations, the operating frequency of the PA must be accounted for when selecting component values.

A method of operation for the subject invention comprises the steps of: advancing the phase of a positive phase output of a differential PA a first amount; retarding the phase of a negative phase output of the differential PA a second amount, the first and second amounts being such that, at a point of combination, the adjusted phases of the positive and negative PA outputs are about equal; adjusting the output impedance of the positive phase output of the PA so that, at the point of combination, it is a desired value; adjusting the output impedance of the negative phase output of the PA so that, at the point of combination, it is a desired value; and combining the adjusted positive and negative phase outputs of the PA at the point of combination to form a single-ended output, such that the output impedance of the single-ended output is about equal to a desired output impedance.

In one embodiment, the desired output impedance is a resistive output impedance $Z_0$. In this embodiment, the first adjusting step comprises adjusting the output impedance of the positive phase output of the PA such that, at the point of combination, it is about equal to twice $Z_0$, and the second adjusting steps comprises adjusting the output impedance of the negative phase output of the PA such that, at the point of combination, it is about equal to twice $Z_0$.

In one implementation, the second adjusting step comprises the substeps of retarding the phase of the negative phase output of the PA by a third amount, and then further retarding the phase of this negative phase output by a fourth amount, the first, third, and fourth amounts being such that, at the point of combination, the adjusted phases of the positive and negative phase PA outputs are about equal.

A method of implementing the subject invention comprises the steps of: coupling to a positive phase output of a PA a lead network configured to advance the phase of the positive phase output of the PA by a first amount and to adjust the output impedance thereof to about twice a desired resistive output impedance $Z_0$; coupling to a negative phase output of the PA a lag network configured to retard the phase of the negative phase output of the PA by a second amount and to adjust the output impedance thereof to about twice the desired resistive output impedance $Z_0$; coupling in series with the lag network a delay element configured to further retard the negative phase output of the PA by a third amount, the first, second, and third amounts being such that, at a point of combination, the adjusted phases of the positive and negative PA outputs are about equal; and combining the outputs of the delay element and the lead network at the point of combination to form a single-ended output, such that the output impedance of the single-ended output is about equal to the desired resistive output impedance $Z_0$.

A benefit of the BALUN circuit of the subject invention is that it combines the functions of PA output matching, and BALUN transforming into a single circuit.

Another benefit is that it is easy to implement in comparison to a conventional BALUN circuit.

A third benefit is that it is very low in cost, and consumes little space, compared to a conventional BALUN circuit.

DETAILED DESCRIPTION OF THE PREFERRED EMBODIMENTS

I. Example Environment

Figure 1:
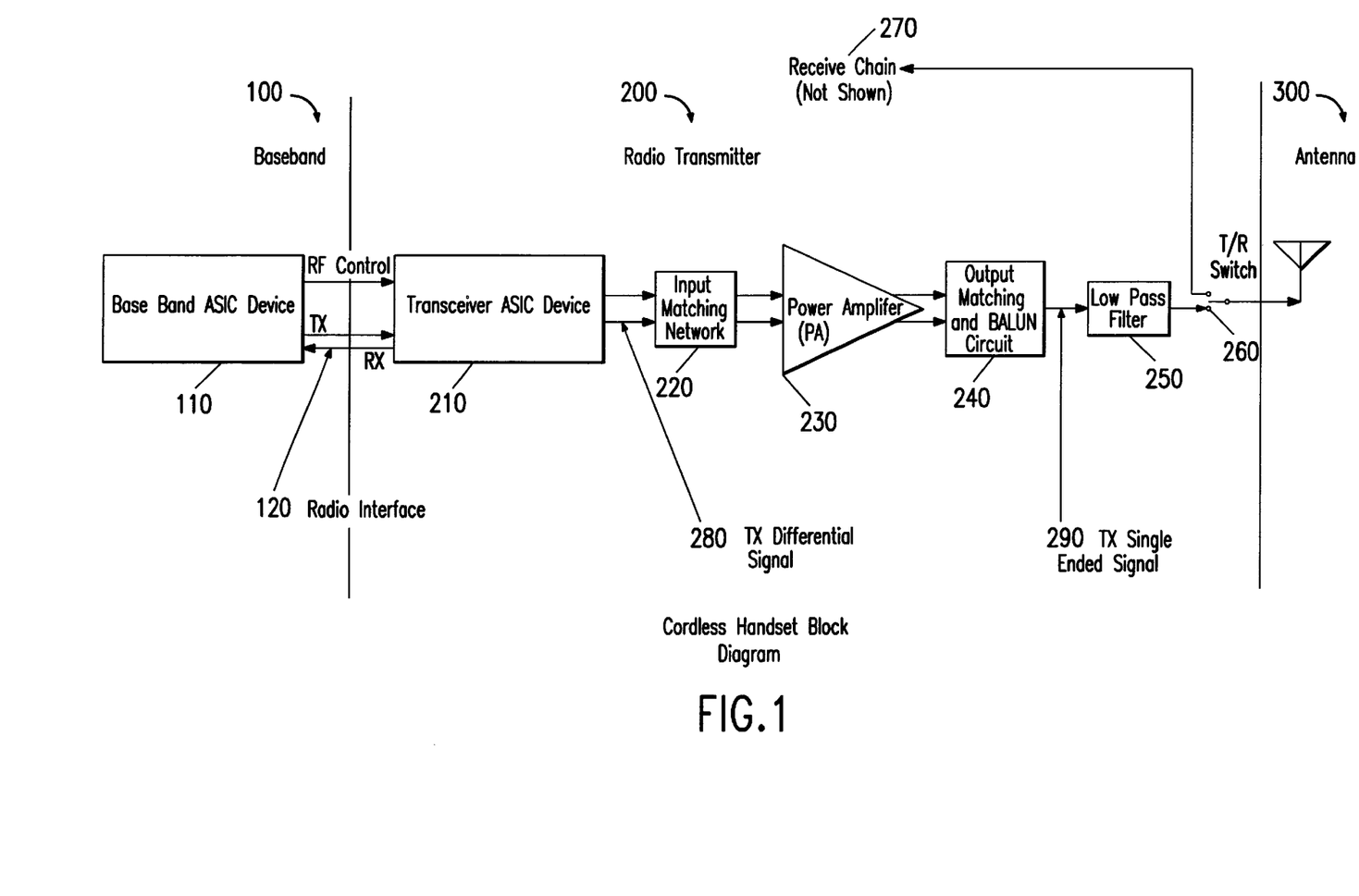
FIG. 1 illustrates a cordless handset block diagram.

A cordless handset block diagram is shown in FIG. 1. The handset represents an example environment for the impedance matching and BALUN circuit of the invention. The handset consists of a baseband section 100, a radio section 200, and an antenna 300. The baseband section consists of a baseband ASIC device 110. The baseband device does all the processing in the handset and controls many interfaces. One of these interfaces is the RF interface 120.

The radio section 200 communicates with and is controlled by the baseband device 110 over the RF interface via the transceiver ASIC 210. This transceiver ASIC contains a majority of the circuits of both the receive chain 270 and the transmit chain. The subject of this discussion involves the portion of the transmit chain between the transceiver ASIC 210 and the antenna 300. Therefore, details of the receive chain will be left out.

In the transmit chain, baseband data is passed from the baseband device to the transceiver via the RF interface. The transceiver ASIC converts the baseband data to an analog signal and encodes it onto the RF carrier signal. This RF signal is output from the transceiver ASIC as a pair of differential signals 280. The differential signals are then sent to a PA 230 with differential inputs and outputs. Due to impedance mismatch between the transceiver outputs and the PA inputs, an input matching network 220 may be required.

The PA will amplify the RF signals from the transceiver. For example, a typical RF small signal gain for the PA would be 28 dB. The amplified RF signals are then sent to the BALUN circuit 240 via the PA's differential outputs. The circuit is designed so that its output is a single ended signal 290 with the desired impedance. The low pass filter 250 of the next stage will determine the desired signal impedance. The impedance of the single ended signal must match the input impedance of the low pass filter.

The low pass filter follows the PA to ensure that only energy in the desired transmit band is transmitted via the antenna 300. Before the signal reaches the antenna, it passes through a switch 260, which multiplexes the signal path between the receive chain 270 and the transmit chain from and to the antenna. The antenna then transmits the signal to the handset's base station.

II. Preferred Embodiments

Figure 2:
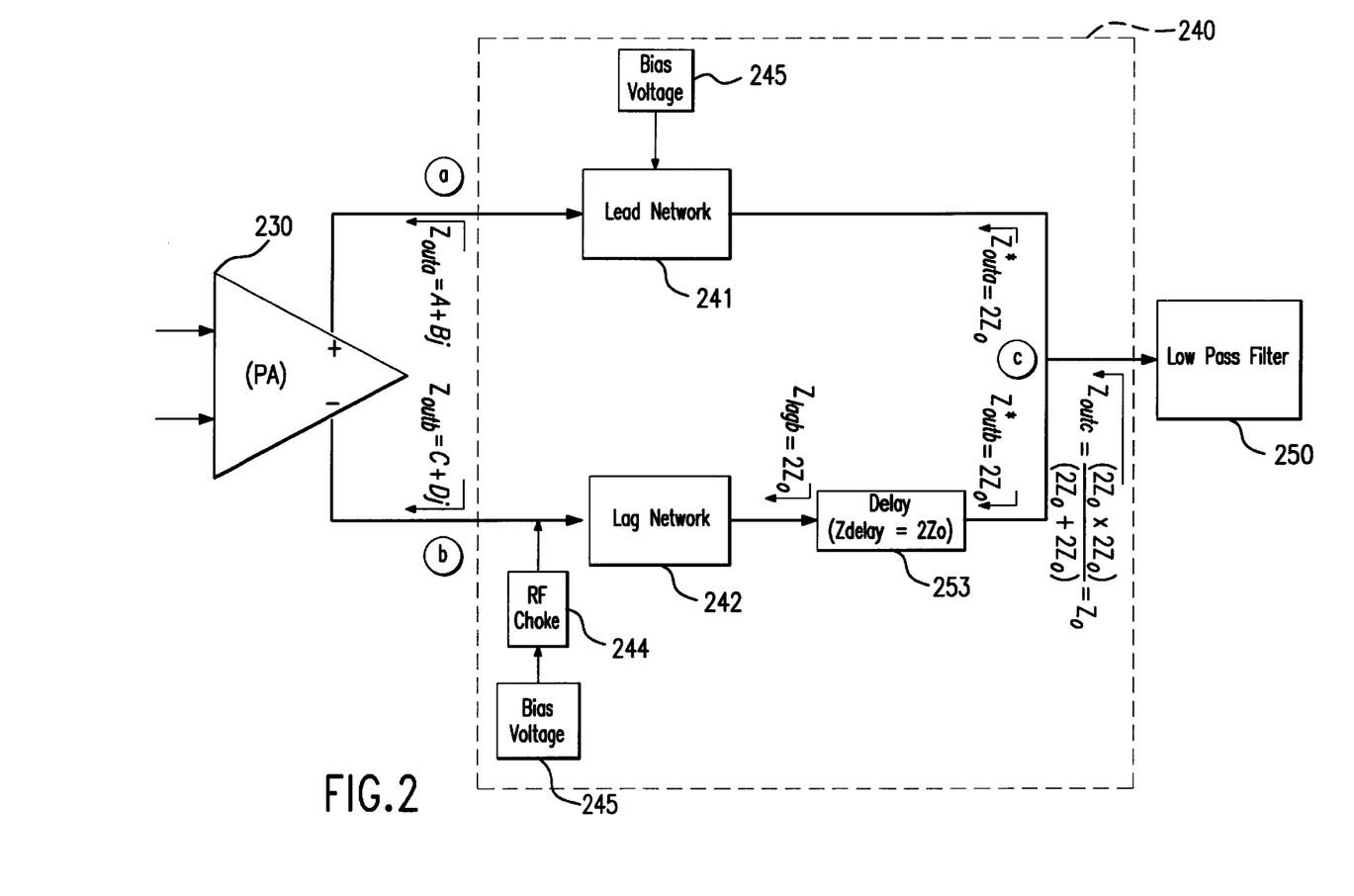
FIG. 2 illustrates a first embodiment of the a BALUN circuit in accordance with the invention.

FIG. 2 illustrates a first embodiment of a BALUN circuit designed in accordance with the subject invention in the example environment of FIG. 1. The circuit is comprised of lead network 241, lag network 242, and delay element 253. The lead network is in series with branch a, the positive phase differential output of the PA. The lag network and the delay element are in series with branch b, the negative phase differential output of the PA. The two branches are then combined at point c.

The lead network is configured to advance the phase of the positive phase output of the PA by a first amount $\Phi_1$, and the lag network is configured to retard the phase of the negative phase output by a second amount $\Phi_2$. The delay element is configured to further retard the phase of the negative phase output by a third amount $\Phi_3$. The first, second, and third amounts are such that the adjusted phases of the positive and negative PA outputs at the point c of combination are about equal.

Figure 7:
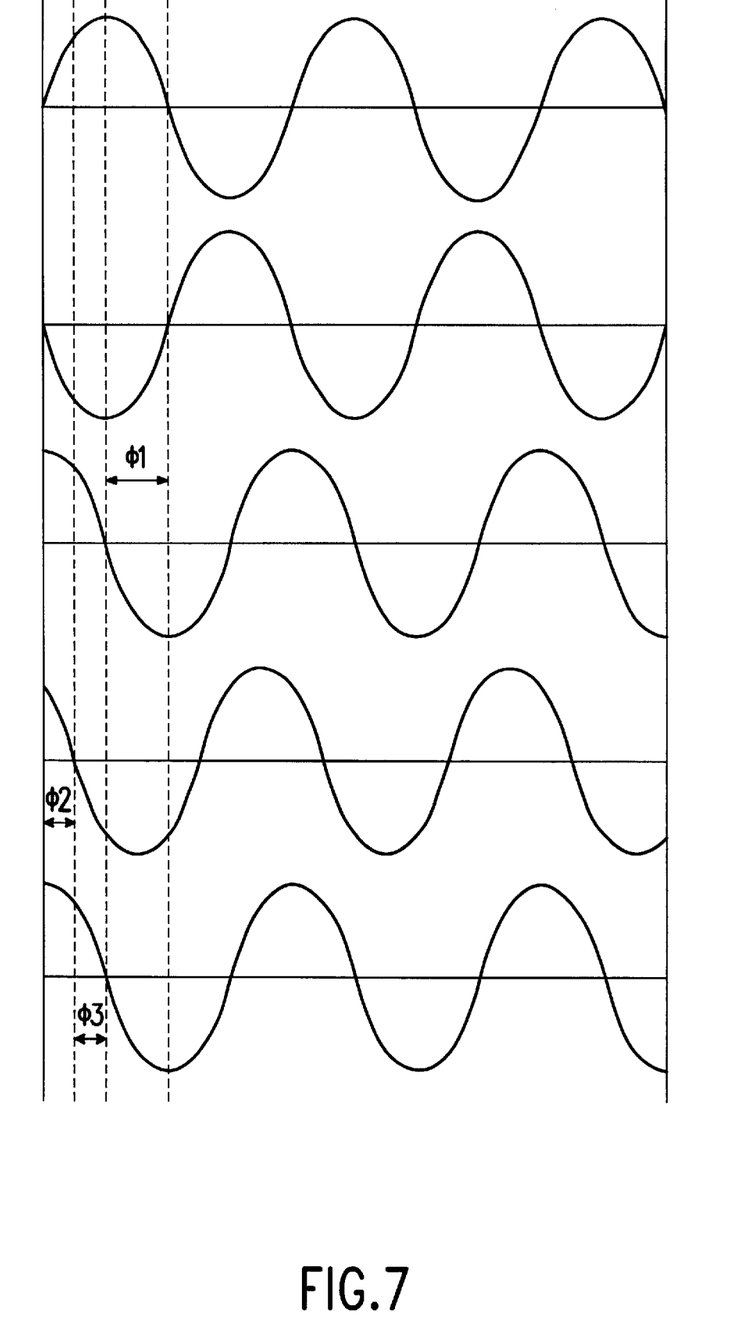
FIG. 7 is example waveforms further illustrating operation of the subject invention.

The situation can be further explained with reference to FIGS. 7A–7E. FIG. 7A illustrates an exemplary positive phase output of the PA, and FIG. 7B illustrates an exemplary negative phase output of the PA. FIG. 7C illustrates an exemplary output of the lead network 241. As illustrated, the phase of the positive phase PA output has been advanced by the first amount $\Phi_1$. Similarly, FIG. 7D illustrates an exemplary output of the lag network 242. As illustrated, the phase of the negative phase PA output has been retarded by the second amount $\Phi_2$.

FIG. 7E illustrates an exemplary output of the delay element 243. As illustrated, the phase of the negative phase PA output has been further retarded by the third amount $\Phi_3$. As illustrated by comparing FIGS. 7C and 7E, the first, second, and third amounts are such that the adjusted phase of the positive phase output is about equal to the adjusted phase of the negative phase output.

For purposes of this disclosure, phrases such as "about" or "approximately" or "substantially" are intended to allow for tolerances which are acceptable to those of skill in the art who practice the invention.

In one implementation, as illustrated in FIG. 2, the bias voltage 245 for the positive signal path (branch a) is connected through the lead network, and the bias voltage for the negative signal path (branch b) is connected via a RF choke. In one implementation example, this choke is a printed transmission line, as opposed to a discrete component, in order to save cost and space. The purpose of the choke is to act as a high impedance at the RF frequency of the transmit signal. This will prevent the transmit signal interfering with the operation of other circuits in the handset.

Figure 3:
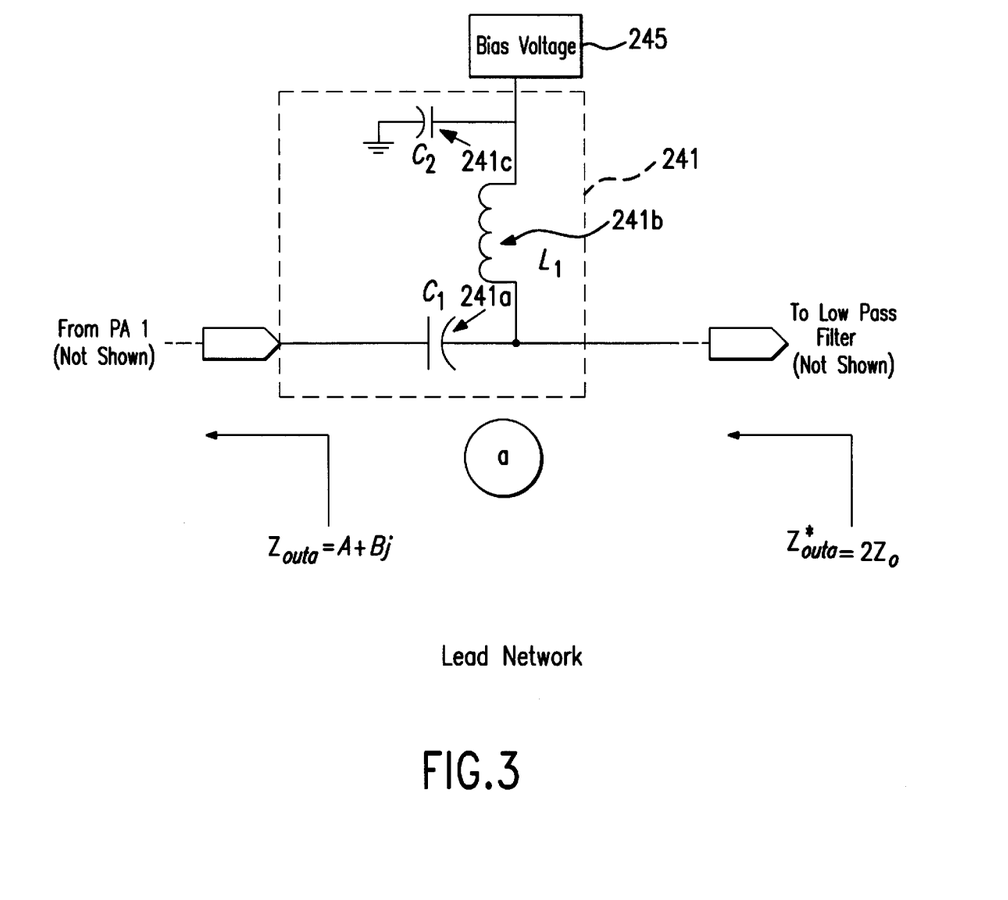
FIG. 3 illustrates a lead network of the first embodiment.

In one implementation, the lead network 241 is a high pass network such as that illustrated in FIG. 3. As illustrated, in this implementation, the high pass network comprises inductor 241b ($L_1$) and capacitor 241a ($C_1$) configured to form a high pass filter. The capacitor 241c (C2) in FIG. 3 acts as an AC coupling capacitor. This will couple any AC signals to ground, but keep the DC supply signal from shorting to ground.

Figure 4:
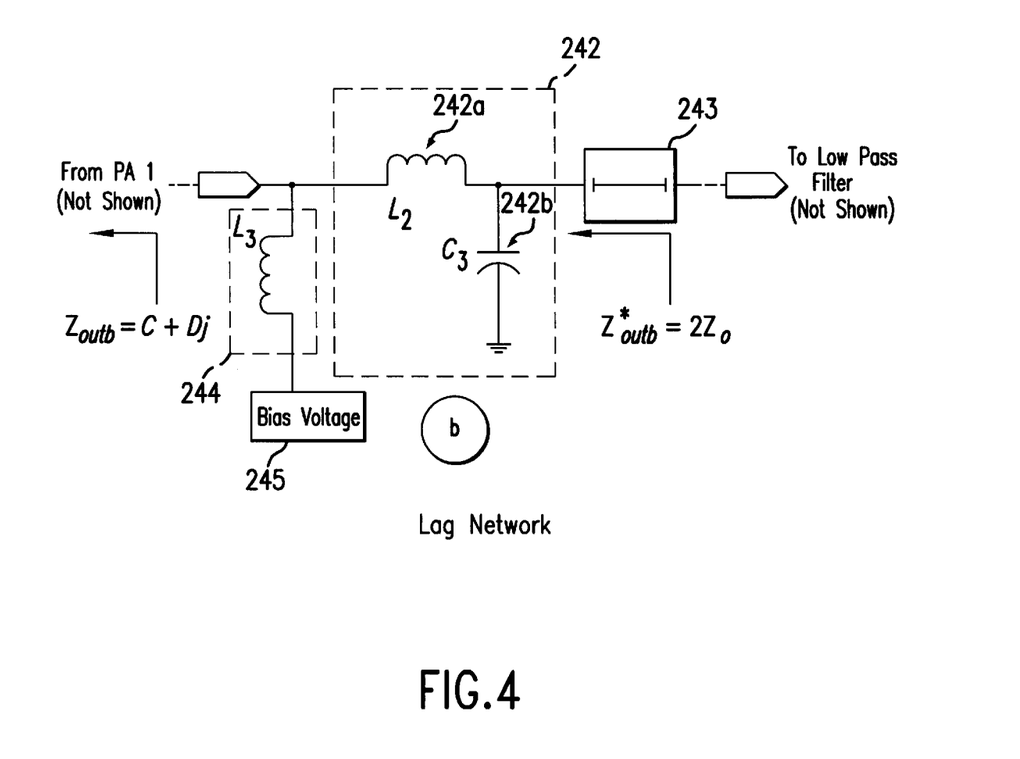
FIG. 4 illustrates a lag network of the first embodiment.

Similarly, in this implementation, the lag network 242 is a low pass network such as that illustrated in FIG. 4. As illustrated, in this implementation, the low pass network comprises inductor 242a ($L_2$) and capacitor 242b ($C_2$) configured to form a low pass filter.

In one implementation example, the desired output impedance of the single-ended output is a resistive value $Z_0$. In this implementation example, the values of $L_1$ and $C_1$ are selected using a Smith chart or the like so that the output impedance of the positive phase PA output, which can be represented as $Z_{outa}=A+Bj$, is transformed to $Z_{outa}^*=2Z_0$, where $Z_0$ is the desired resistive output impedance of the single-ended output.

Similarly, in this implementation example, the values of $L_2$ and $C_2$ are selected so that the output impedance of the negative phase PA output, which can be represented as $Z_{outb}=C+Dj$, is transformed to $Z_{outb}^*=2Z_0$, where $Z_0$ is the desired output impedance of the single-ended output.

The delay element 243 in this implementation similarly has an impedance about equal to $2Z_0$. That ensures that it does not act on the impedance of the signal after it passes through the low pass filter. The width and length of the delay element are selected in this example to achieve the appropriate impedance $Z_0$ at the single-ended output, and also to achieve proper phase alignment between the signals at branches a and b at the point of combination c.

More specifically, the output signal of branch a, with impedance of about $2Z_0$, and the output of branch b, also with impedance of about $2Z_0$, are then combined at point c in FIG. 2. The parallel combination of these two results in the desired output impedance of about $Z_0$ according to the following equation: $Z_{outc}=(2Z_0 \times 2Z_0)/(2Z_0+2Z_0)=Z_0$.

In one implementation example, the inductors in the high and low pass networks, and the delay element, are each printed microstrip elements on the PCB board embodying the BALUN circuit, while the capacitors in the high and low pass networks are discrete components. These printed elements can be microstrip, embedded microstrip, or stripline elements. Alternatively, these elements could be composed of any other type of transmission line in place of the printed element or even discrete components. However, the printed transmission lines are advantageous because they are the least costly and require the least amount of board space.

To further reduce cost, the discrete shunt capacitor $C_3$ (242b) in the lag network depicted in FIG. 4, can also be implemented as a printed microstrip element. Those who are skilled in the art of printed transmission lines know that an open shunt stop of less than ¼ wavelength is equivalent to a shunt capacitor.

Figure 8A:
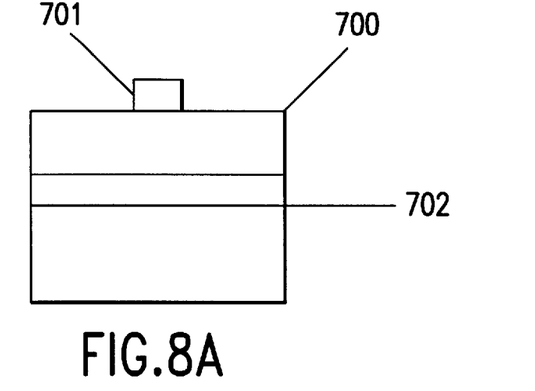
FIGS. 8A–C illustrate embodiments of printed transmission elements.
Figure 8B:
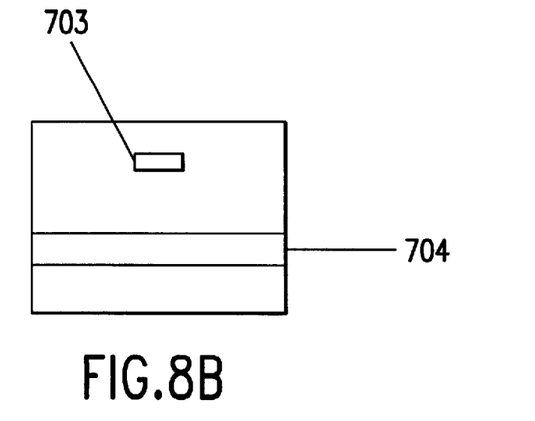
Figure 8C:
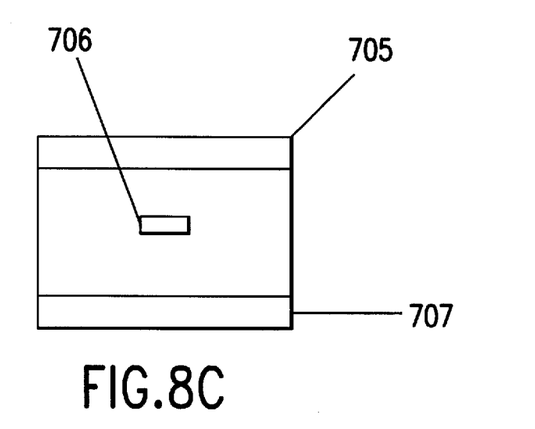

FIGS. 8A, 8B, and 8C illustrate the different printed transmission line elements mentioned above. FIG. 8A is a printed microstrip. This embodiment consists of a trace 701 on the external layer of a printed circuit board 700 referencing a plane 702 on an internal layer. Looked at end on, there is a hot conductor, the trace on the top, and the internal plane is a return conductor. The microstrip is therefore a variant of a 2-wire transmission line.

FIG. 8B illustrates an embedded microstrip. In this embodiment, the trace 703 is on an internal layer as well as the plane 704. FIG. 8C illustrates a stripline. In this embodiment, the trace 706 is centered between two planes 705, 707. Compared to the other embodiments, the stripline is the most predictable impedance model and, due to the shielding on both sides, the most noise immune. The embodiment of FIG. 8B is the least controllable impedance model of the three depicted.

In one configuration, the PA is designed for a 2.4 GHz cordless handset system operation and the single ended output is connected to a low pass filter. The signal is pass ed through the filter before being transmitted via an antenna. In this implementation the component values and circuit characteristics are chosen for 2.4 GHz operation.

In a second implementation, the design is used in a 900 MHz cordless handset system. In this case, the component values and circuit characteristics are selected for 900 MHz operation. Additional implementations are possible in which the design is utilized in a direct sequence spread spectrum (DSSS) wireless system, a Frequency Hop spread spectrum (FHSS) wireless system, a wireless cellular system, a wireless local area network (WLAN) system, a Wireless Modem, a security system, or a wireless inventory system. In fact, the design can be utilized in any system that uses a differential PA keeping in mind that, in each of these implementations, the operating frequency of the PA must be accounted for when selecting component values.

III. Reference Design

Figure 9A:
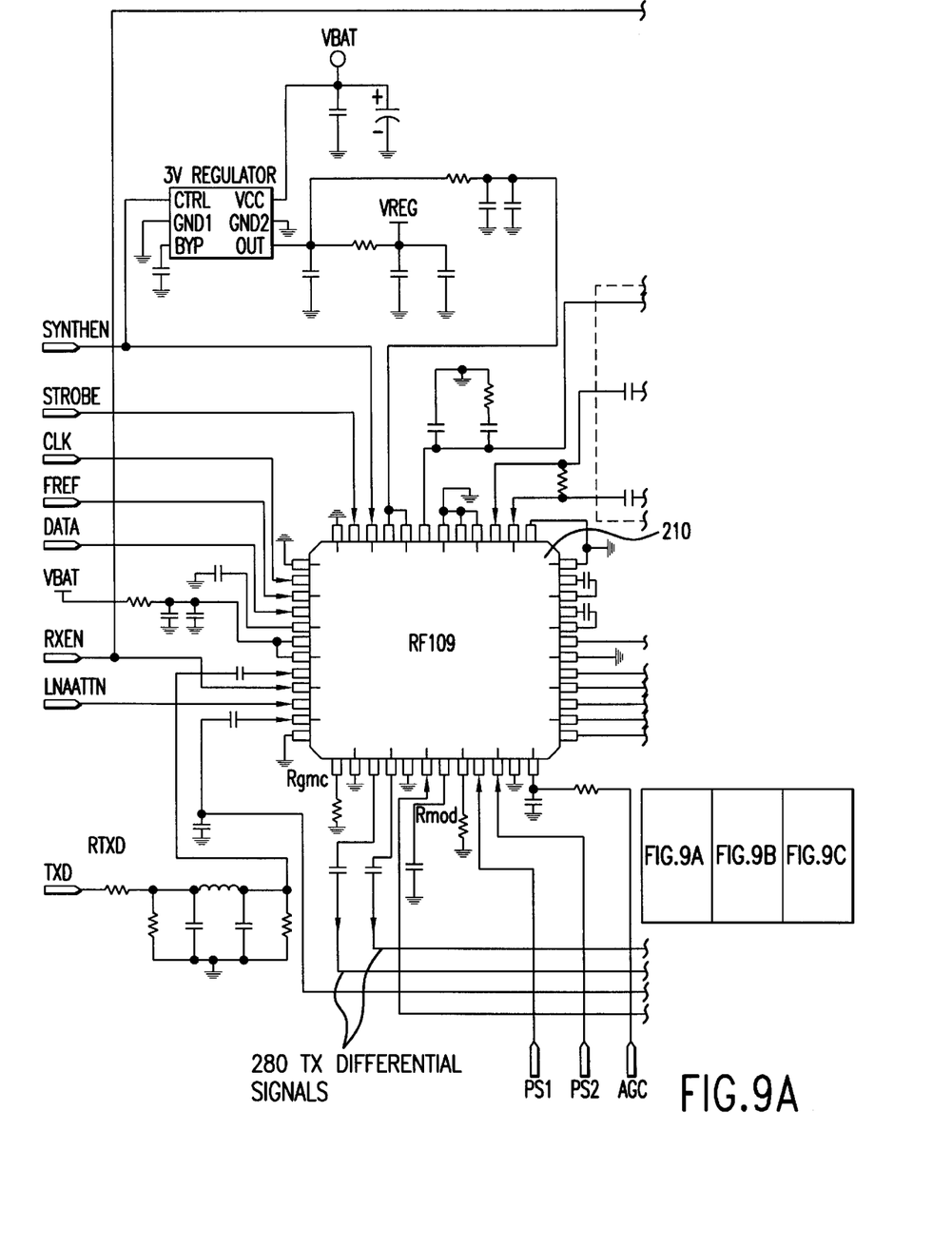
FIG. 9 is a schematic for an example design in accordance with the invention.
Figure 9B:
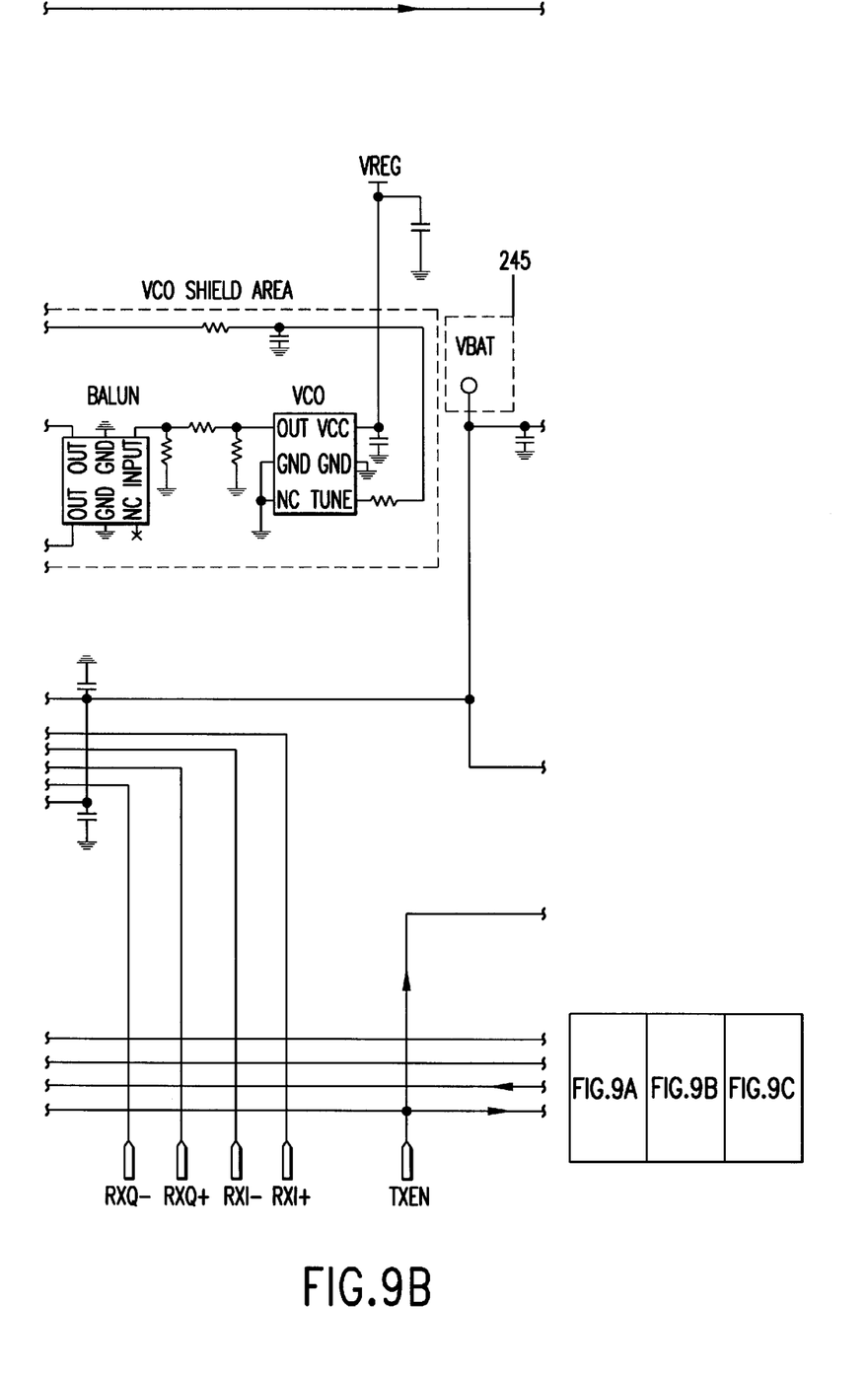
Figure 9C:
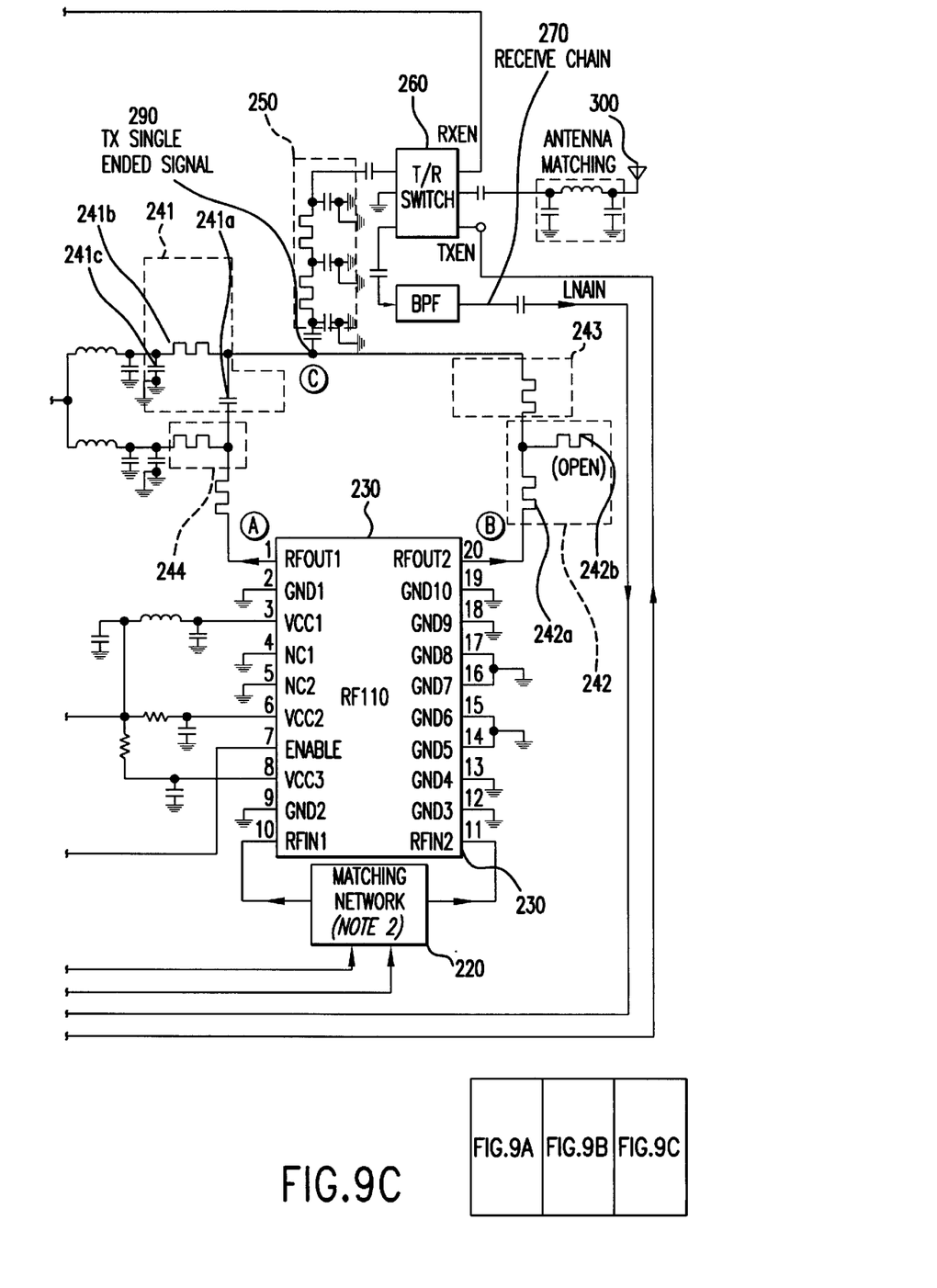

FIG. 9 illustrates a schematic for an example design of a 2.4 GHz cordless handset radio in accordance with the subject invention. The example design consists of a transceiver ASIC 210 that converts baseband data to an analog signal. This analog signal is then encoded onto differential RF signals 280 that are then sent to a differential PA 230. Because of impedance mismatch between the transceiver ASIC outputs and the PA inputs, an input matching network 220 may be required.

The PA will then amplify the RF signals from the transceiver. The amplified RF signals are then sent to the BALUN circuit. The BALUN circuit consists of a lead network 241, a lag network 242 and a delay element 243. The circuit is designed so that its output is a single ended signal with the desired impedance. The impedance of the single ended output is determined by the low pass filter 250 of the following stage. The impedance of the signal and the filter should be about equal for maximum power transfer.

The low pass filter follows the PA to ensure that only energy in the desired transmit band is transmitted via the antenna 300. Before the signal reaches the antenna, it passes through a switch 260, which multiplexes the signal path between the receive chain 270 and the transmit chain from and to the antenna. The antenna then transmits the signal to the handset's base station.

In the embodiment shown in the schematic, the lead network is in series with branch A, the positive phase differential output of the PA. The lag network and the delay element are in series with branch B, the negative phase differential output of the PA. The two branches are then combined at point C.

The lead network is implemented as a high pass circuit comprised of capacitor 241a and printed transmission line 241b. Additionally, capacitor 241c acts as an AC coupling capacitor. This will couple any AC signal to ground, but prevent the DC supply 245 from shorting to ground. The DC supply for branch A is connected via the printed transmission element 241b.

The lag network is in series with branch B and is implemented as a low pass circuit comprised of printed transmission element 242a and printed element 242b, which acts as a capacitor. 242b is actually a printed shunt stop of less than ¼ wavelength of the RF signal. Therefore, the element will appear as a shunt capacitor. Following the lag network in branch B is the printed delay element 243. Also, the DC supply for branch B is connected via a RF choke 244 implemented as a printed element.

The two branches are then combined at point C and the single ended output is sent to the low pass filter and eventually the antenna. It should be noted that all the printed elements in the example design are implemented as printed microstrips. Additionally, there are many components in and around the PA and BALUN circuit that are not identified in the above description. This is because these components are not directly related to the invention and perform secondary task such as signal bypassing or noise filtering.

IV. Method of Implementation

Figure 5:
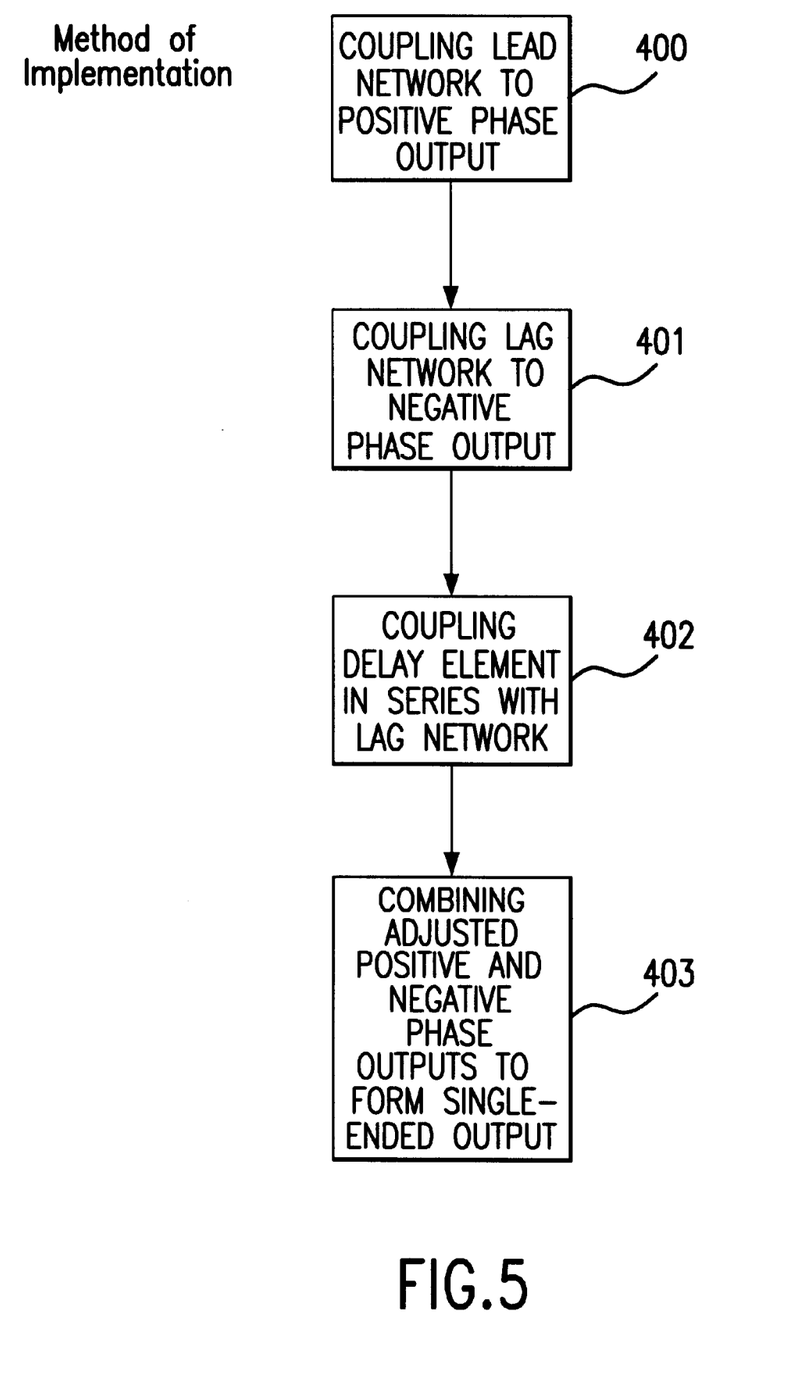
FIG. 5 illustrates a process of implementing the invention.

A method of implementing the subject invention is illustrated in FIG. 5. As illustrated, the method comprises, in step 400, coupling to a positive phase output of a PA a lead network configured to advance the phase of the positive phase output of the PA by a first amount. In one embodiment, the lead network is configured to adjust the output impedance of this output to about twice a desired resistive output impedance $Z_0$.

The method further comprises, in step 401, coupling to a negative phase output of the PA a lag network configured to retard the phase of the negative phase output of the PA by a second amount. In one embodiment, the lag network is configured to adjust the output impedance of this output to about twice the desired resistive output impedance $Z_0$.

The method further comprises, in step 402, coupling in series with the lag network a delay element configured to further retard the negative phase output of the PA by a third amount. The first, second, and third amounts being such that, at a point of combination, the adjusted phases of the positive and negative PA outputs are about equal.

The method proceeds to step 403, which comprises combining the outputs of the delay element and the lead network at the point of combination to form a single-ended output. In one embodiment, the output impedance of the single-ended output is about equal to the desired resistive output impedance $Z_0$.

V. Method of Operation

Figure 6:
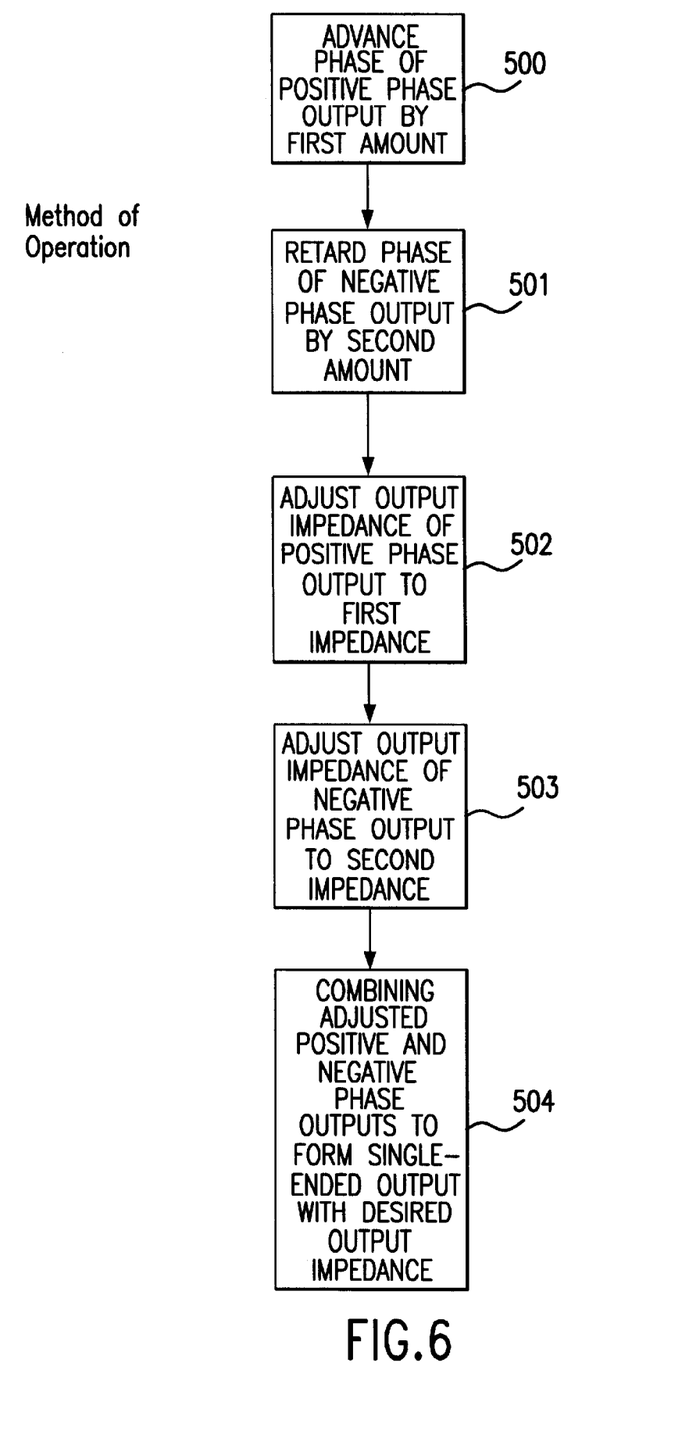
FIG. 6 illustrates a method of operation of the invention.

A method of operation for the subject invention is illustrated in FIG. 6. As illustrated, the method comprises, in step 500, advancing the phase of a positive phase output of a differential PA by a first amount; and in step 501, retarding the phase of a negative phase output of the differential PA by a second amount. The first and second amounts being such that, at a point of combination, the adjusted phases of the positive and negative PA outputs are about equal.

The method further comprises, in step 502, adjusting the output impedance of the positive phase output of the PA so that, at the point of combination, it is a desired value. And, in step 503, adjusting the output impedance of the negative phase output of the PA so that, at the point of combination, it is a desired value.

The method proceeds to step 504, which comprises combining the adjusted positive and negative phase outputs of the PA at the point of combination to form a single-ended output, such that the output impedance of the single-ended output is about equal to a desired output impedance.

In one embodiment, the desired output impedance is a resistive output impedance $Z_0$. In this embodiment, the first adjusting step 502 comprises adjusting the output impedance of the positive phase output of the PA such that, at the point of combination, it is about equal to twice $Z_0$. And the second adjusting step 503 comprises adjusting the output impedance of the negative phase output of the PA such that, at the point of combination, it is about equal to twice $Z_0$.

In one implementation, the second adjusting step 503 comprises the substeps of retarding the phase of the negative phase output of the PA by a third amount, and then further retarding the phase of this negative phase output by a fourth amount, the first, third, and fourth amounts being such that, at the point of combination, the adjusted phases of the positive and negative phase PA outputs are about equal.

A benefit of the BALUN circuit of the subject invention is that it combines the functions of PA output matching, and BALUN transforming in a single circuit.

Another benefit is that it is easy to implement in comparison to conventional BALUN circuit.

A third benefit is that it is very low in cost, and consumes little space, compared to conventional BALUN circuit.

While particular embodiments, implementations, and implementation examples have been shown and described, it should be appreciated that many other embodiments, implementations, and implementation examples are within the scope of the subject invention, and that the subject invention is not to be restricted except in light of the claims and their equivalents.

What is claimed is:

1. A BALUN circuit comprising:
   a lead network for advancing the phase of a positive phase output of a differential power amplifier by a first amount;
   a lag network for retarding the phase of a negative phase output of a differential power amplifier by a second amount;
   a delay element coupled in series with the lag network for further retarding the phase of the negative phase output of the power amplifier by a third amount, the first, second, and third amounts being such that, at a point of combination, the adjusted phases of the positive and negative phase outputs are about equal; and
   a single-ended output formed by combining at the point of combination the outputs of the lead network and the delay element.

2. The circuit of claim 1 in which the lead network comprises a high pass network.

3. The circuit of claim 2 in which the high pass network is a high pass filter which comprises an inductor and capacitor.

4. The circuit of claim 3 in which the lag network is a low pass network.

5. The circuit of claim 4 in which the low pass network is a low pass filter which comprises an inductor and capacitor.

6. The circuit of claim 5 in which the delay element is a printed elements.

7. The circuit of claim 6 in which the inductors of the high and low pass filters are printed elements.

8. The circuit of claim 7 in which the shunt capacitor of the lag network is a printed element.

9. The circuit of claim 7 in which the printed elements are printed microstrips.

10. The circuit of claim 1 in which the output impedance of the single-ended output is a desired output impedance.

11. The circuit of claim 11 in which the output impedance is a desired resistive output impedance of about $Z_0$.

12. The circuit of claim 11 in which the output impedance of the lead network is about twice $Z_0$.

13. The circuit of claim 12 in which the output impedance of the lag network is about twice $Z_0$.

14. The circuit of claim 13 in which the impedance of the delay element is about twice $Z_0$.

15. The circuit of claim 14 in which the single-ended output is formed from the parallel combination of the output of the lead network and the output of the delay element.

16. An RF transmitter comprising:
    a transceiver that receives baseband data and encodes it onto an RF differential pair of signals;
    a power amplifier (PA) for amplifying the differential RF signals from the transceiver onto a differential pair of output signals comprising a positive phase signal and a negative phase signal;
    a BALUN circuit comprising:
       a lead network that advances the phase of the positive phase signal by a first amount;
       a lag network that retards the phase of the negative phase signal by a second amount;
       a delay element for further retarding the phase of the negative phase signal by a third amount, the first, second, and third amounts being such that the adjusted phase of the positive and negative phase outputs at a point of combination is about equal;
       a single-ended output formed by combining at the point of combination the output of the lead network and the output of the delay element.

17. The transmitter of claim 16 further comprising:
    a filter for filtering the single-ended output;
    a switch for switching between transmit and receive modes of operation; and
    an antenna for receiving and transmitting the filtered signal.

18. The RF transmitter of claim 16 in which the output impedance of the single-ended output is about a desired output impedance.

19. The RF transmitter of claim 18 in which the desired output impedance is a resistive output impedance $Z_0$.

20. The RF transmitter of claim 19 in which the output impedance of the lead network is about twice $Z_0$.

21. The RF transmitter of claim 20 in which the output impedance of the lag network is about twice $Z_0$.

22. The RF transmitter of claim 21 in which the impedance of the delay element is about twice $Z_0$.

23. The RF transmitter of claim 22 in which the single-ended output is formed by combining in parallel the output of the lead network and the output of the delay element.

24. The RF transmitter of claim 16 in a cordless handset.

25. The RF Transmitter of claim 16 in a mobile wireless communications device.

26. A method of implementing a BALUN circuit comprising:
    coupling a lead network to a positive phase output of a differential power amplifier, the lead network configured to advance the phase of the positive phase output by a first amount;
    coupling a lag network to a negative phase output of the differential power amplifier, the lag network configured to retard the phase of the negative phase output by a second amount;
    coupling a delay element in series with the lag network, the delay element configured to further retard the phase of the phase of the negative phase output by a third amount, the first, second, and third amounts such that the phases of the adjusted positive and negative phase outputs of the power amplifier, at a point of combination, are about the same; and combining the adjusted positive and negative phase outputs at the point of combination to form a single-ended output.

27. The method of claim 26 further comprising coupling a lead network to the positive phase output of the power amplifier, wherein the lead network is configured to adjust the output impedance of the positive phase output to about twice a desired resistive output impedance $Z_0$ of the single-ended output.

28. The method of claim 27 further comprising coupling a lag network to the negative phase output of the power amplifier, wherein the lag network is configured to adjust the output impedance of the negative phase output to about twice $Z_0$.

29. The method of claim 28 further comprising coupling in series with the lead network a delay element having an impedance of about twice $Z_0$.

30. The method of claim 29 further comprising combining in parallel the outputs of the lead network and the delay element to form the single-ended output, whereby the output impedance of the single-ended output is about $Z_0$.

31. A method of combining the differential outputs of a power amplifier comprising:

advancing the phase of the positive phase output of the power amplifier by a first amount;

retarding the phase of the negative phase output of the power amplifier by a second amount;

further retarding the phase of the negative phase output of the power amplifier by a third amount;

adjusting the impedance of the positive phase output of the power amplifier to a first impedance;

adjusting the impedance of the negative phase output of the power amplifier to a second impedance; and combining the adjusted positive and negative phase outputs of the power amplifier at a node to form a single-ended output, the first, second, and third amounts being such that the adjusted phases of the positive and negative phase outputs are about the same, the first and second desired impedances being such that the output impedance of the single-ended output is about a desired output impedance.

32. The method of claim 31 wherein the first and second impedances are the same.

33. The method of claim 32 wherein the desired output impedance of the single-ended output is a resistive impedance $Z_0$.

34. The method of claim 33 wherein the first and second impedances are about twice $Z_0$.

35. The method of claim 31 further comprising retarding the phase of the positive phase output of the power amplifier by a fourth amount, the first, second, third, and fourth amounts being such that the phases of the adjusted positive and negative phase outputs, at the point of combination, are about the same.

36. A BALUN circuit comprising:

a lead network for advancing the phase of a first component of a differential signal by a first amount;

a lag network for retarding the phase of a second component of the differential signal by a second amount;

a delay element coupled in series with the lag network for retarding the phase of the second component of the differential signal by a third amount; and a combining node for combining signals derived from the outputs of the lead network and one or the other of the delay element and the lag network to form a single-ended signal, the first, second, and third amounts being such that, at the combining node, the phases of the signals being combined are about the same.

37. The circuit of claim 36 wherein the first component of the differential signal is the positive component.

38. The circuit of claim 36 wherein the second component of the differential signal is the negative component.

39. A BALUN circuit comprising:

lead means for advancing the phase of a first component of a differential signal by a first amount;

lag means for retarding the phase of a second component of the differential signal by a second amount;

delay means coupled in series with the lag means for retarding the phase of the second component of the differential signal by a third amount; and combining means for combining signals derived from the outputs of the lead means and one or the other of the delay means and the lag means to form a single-ended signal, the first, second, and third amounts being such that, at the combining means, the phases of the signals being combined are about the same.

40. A method of combining first and second components of a differential signal to form a single-ended signal comprising:

advancing the phase of the first component of a differential signal by a first amount;

retarding the phase of the second component of the differential signal by a second amount;

retarding the phase of the second component of the differential signal by a third amount; and combining signals derived from the adjusted first and second components of the differential signal to form a single-ended signal, the first, second, and third amounts being such that the phases of the signals being combined are about the same.

41. A method of combining first and second components of a differential signal to form a single-ended signal comprising:

a step for advancing the phase of the first component of a differential signal by a first amount;

a step for retarding the phase of the second component of the differential signal by a second amount;

a step for retarding the phase of the second component of the differential signal by a third amount; and a step for combining signals derived from the adjusted first and second components of the differential signal to form a single-ended signal, the first, second, and third amounts being such that the phases of the signals being combined are about the same.

* * * * *